United States Patent
Herrmann et al.

(10) Patent No.: US 10,243,117 B2
(45) Date of Patent: Mar. 26, 2019

(54) METHOD FOR PRODUCING OPTOELECTRONIC DEVICES AND SURFACE-MOUNTABLE OPTOELECTRONIC DEVICE

(71) Applicant: OSRAM Opto Semiconductors GmbH, Regensburg (DE)

(72) Inventors: Siegfried Herrmann, Neukirchen (DE); Ion Stoll, Tegernheim (DE); Georg Roßbach, Regensburg (DE)

(73) Assignee: OSRAM OPTO SEMICONDUCTORS GMBH, Regensburg (DE)

(*) Notice: Subject to any disclaimer, the term of this patent is extended or adjusted under 35 U.S.C. 154(b) by 0 days.

(21) Appl. No.: 15/573,820

(22) PCT Filed: May 11, 2016

(86) PCT No.: PCT/EP2016/060590
§ 371 (c)(1),
(2) Date: Nov. 13, 2017

(87) PCT Pub. No.: WO2016/180897
PCT Pub. Date: Nov. 17, 2016

(65) Prior Publication Data
US 2018/0261734 A1 Sep. 13, 2018

(30) Foreign Application Priority Data
May 13, 2015 (DE) .................. 10 2015 107 586

(51) Int. Cl.
*H01L 33/50* (2010.01)
*C25D 13/02* (2006.01)
(Continued)

(52) U.S. Cl.
CPC ............ *H01L 33/505* (2013.01); *C25D 13/02* (2013.01); *C25D 13/12* (2013.01); *H01L 33/007* (2013.01);
(Continued)

(58) Field of Classification Search
CPC ....... H01L 33/505; H01L 33/56; H01L 33/58; H01L 33/54; H01L 33/007;
(Continued)

(56) References Cited

U.S. PATENT DOCUMENTS 8,154,040 B2 * 4/2012 Sorg .................. H01L 24/24
257/88
8,729,592 B2 5/2014 Iduka et al.
(Continued)

FOREIGN PATENT DOCUMENTS

DE 102011087886 A1 6/2013
DE 102012105691 A1 1/2014
(Continued)

*Primary Examiner* — Selim U Ahmed
(74) *Attorney, Agent, or Firm* — Slater Matsil, LLP

(57) ABSTRACT

A method for producing optoelectronic devices and a surface-mountable optoelectronic device are disclosed. In an embodiment the method includes applying semiconductor chips laterally adjacent one another on a carrier, wherein contact sides of the chips face the carrier, and wherein each semiconductor chip comprises contact elements for external electrical contacting which are arranged on the contact side of the semiconductor chip and applying an electrically conductive layer on at least sub-regions of the sides of the semiconductor chips not covered by the carrier, wherein the electrically conductive layer is formed contiguously, and wherein protective elements prevent direct contact of the contact elements with the electrically conductive layer. The method further includes electrophoretically depositing a converter layer on the electrically conductive layer and
(Continued)

removing the electrically conductive layer from regions between the converter layer and the semiconductor chips.

20 Claims, 8 Drawing Sheets

(51) Int. Cl.
    *C25D 13/12*     (2006.01)
    *H01L 33/00*     (2010.01)
    *H01L 33/32*     (2010.01)
    *H01L 33/54*     (2010.01)
    *H01L 33/56*     (2010.01)
    *H01L 33/58*     (2010.01)
    *H01L 33/62*     (2010.01)
    *H01L 33/48*     (2010.01)

(52) U.S. Cl.
    CPC ...... *H01L 33/0079* (2013.01); *H01L 33/0095* (2013.01); *H01L 33/32* (2013.01); *H01L 33/50* (2013.01); *H01L 33/502* (2013.01); *H01L 33/54* (2013.01); *H01L 33/56* (2013.01); *H01L 33/58* (2013.01); *H01L 33/62* (2013.01); *H01L 33/486* (2013.01); *H01L 2224/96* (2013.01); *H01L 2933/005* (2013.01); *H01L 2933/0033* (2013.01); *H01L 2933/0041* (2013.01); *H01L 2933/0058* (2013.01); *H01L 2933/0066* (2013.01)

(58) Field of Classification Search
    CPC ... H01L 33/0095; H01L 33/32; H01L 33/502; H01L 33/62; H01L 33/50; H01L 33/0079; H01L 2933/0058; C25D 13/02; C25D 13/12

See application file for complete search history.

(56) References Cited

U.S. PATENT DOCUMENTS

| | | | |
|---|---|---|---|
| 9,484,511 B2 | 11/2016 | Suenaga et al. | |
| 9,490,397 B2 | 11/2016 | Preuss et al. | |
| 9,559,266 B2 | 1/2017 | Wirth et al. | |
| 9,780,265 B2 | 10/2017 | Herrmann et al. | |
| 9,797,041 B2 | 10/2017 | Chen | |
| 2006/0202105 A1 | 9/2006 | Krames et al. | |
| 2013/0043786 A1 | 2/2013 | Hsieh et al. | |
| 2015/0060935 A1 | 3/2015 | Chang et al. | |
| 2016/0149090 A1 | 5/2016 | Gootz et al. | |
| 2016/0190110 A1* | 6/2016 | Gootz | H01L 27/156 438/27 |
| 2016/0218261 A1 | 7/2016 | Moosburger et al. | |
| 2017/0148966 A1 | 5/2017 | Schwarz et al. | |
| 2018/0122997 A1* | 5/2018 | Herrmann | H01L 33/50 |

FOREIGN PATENT DOCUMENTS

| | | |
|---|---|---|
| DE | 102013109031 A1 | 2/2014 |
| DE | 102012216552 A1 | 3/2014 |
| DE | 102013207611 A1 | 10/2014 |
| DE | 102013106573 A1 | 12/2014 |
| DE | 102013110114 A1 | 4/2015 |
| DE | 102014101492 A1 | 8/2015 |
| DE | 102014108368 A1 | 12/2015 |
| DE | 102015101143 A1 | 7/2016 |
| DE | 102015102460 A1 | 8/2016 |
| DE | 102015102699 A1 | 8/2016 |
| DE | 102015104886 A1 | 10/2016 |
| DE | 102015107588 A1 | 11/2016 |
| DE | 102015107590 A1 | 11/2016 |
| DE | 102015107593 A1 | 11/2016 |
| DE | 102015109852 A1 | 12/2016 |
| EP | 2390933 A1 | 11/2011 |
| EP | 2804225 A1 | 11/2014 |
| JP | 2007134378 A | 5/2007 |
| JP | 2008066365 A | 3/2008 |
| JP | 2011009572 A | 1/2011 |
| JP | 2011249425 A | 12/2011 |
| JP | 2012508987 A | 4/2012 |
| JP | 2012156443 A | 8/2012 |
| JP | 2014241400 A | 12/2014 |
| JP | 201512143 A | 1/2015 |
| WO | 2014001149 A1 | 1/2014 |
| WO | 2014095923 A1 | 6/2014 |
| WO | 2014188296 A1 | 11/2014 |
| WO | 2015036231 A1 | 3/2015 |

* cited by examiner

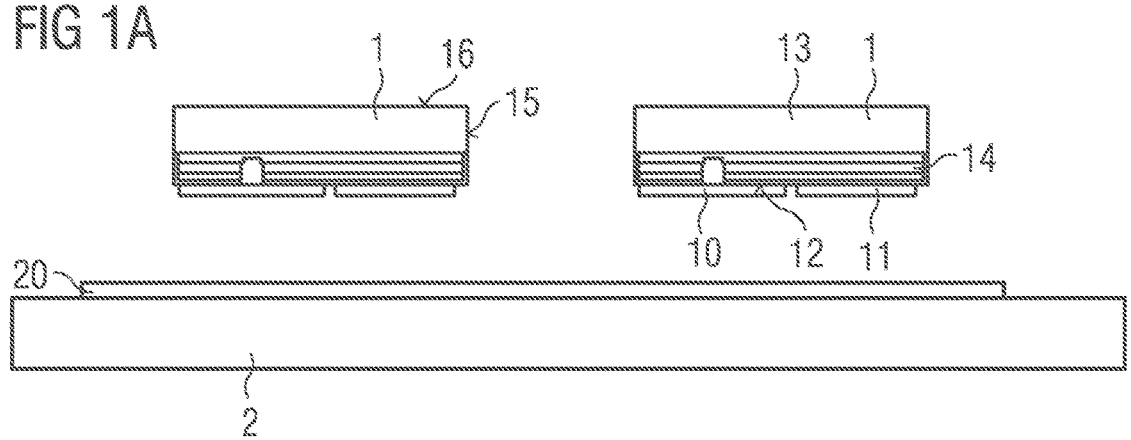
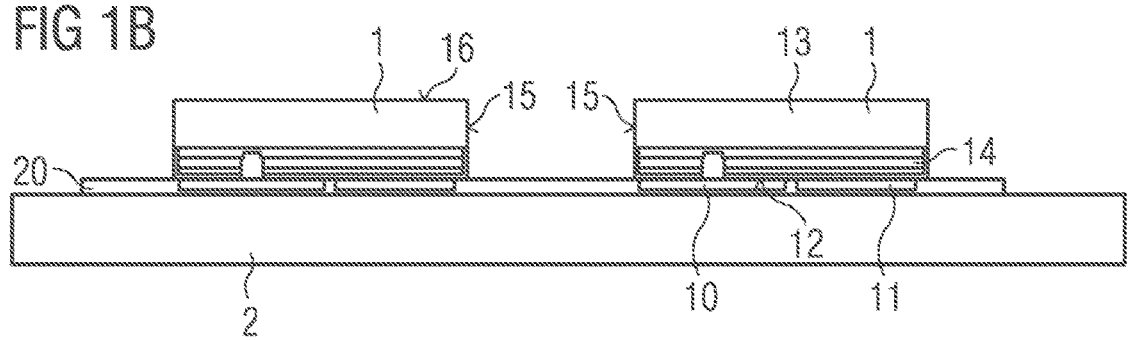
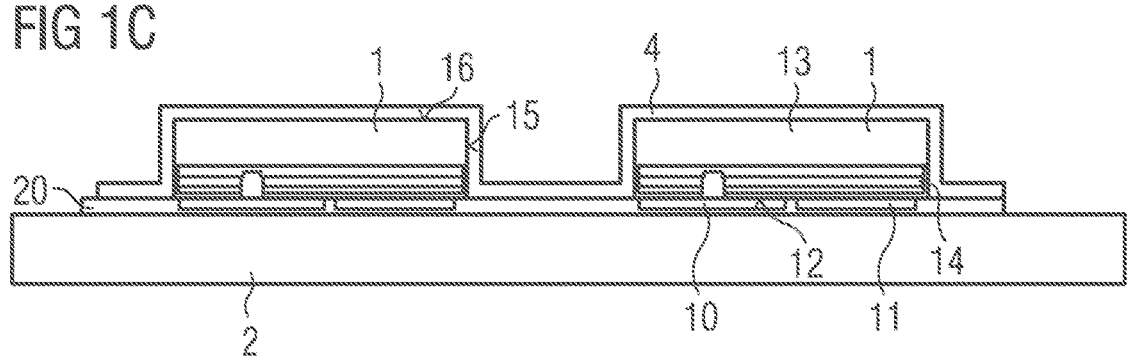
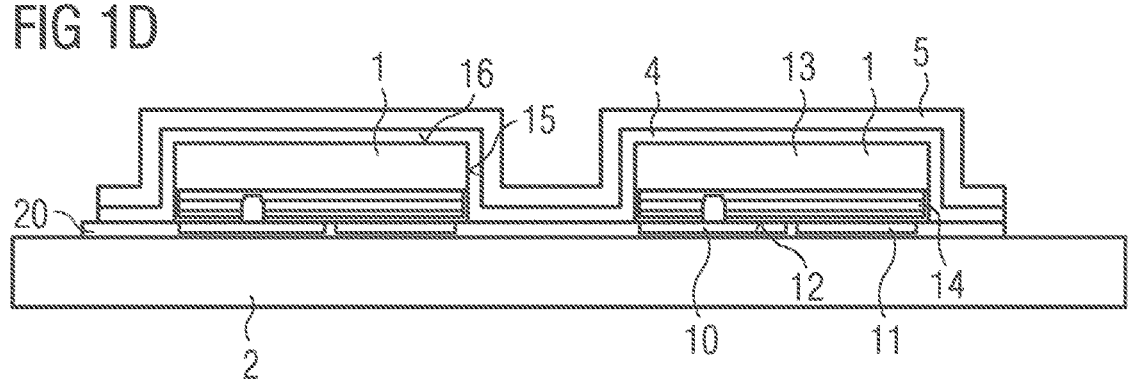

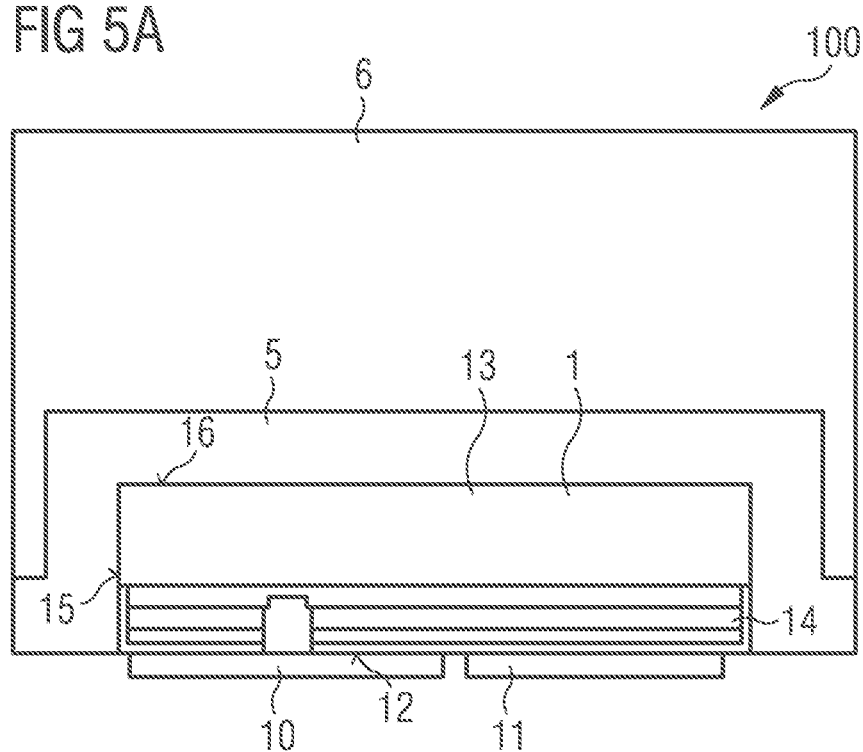
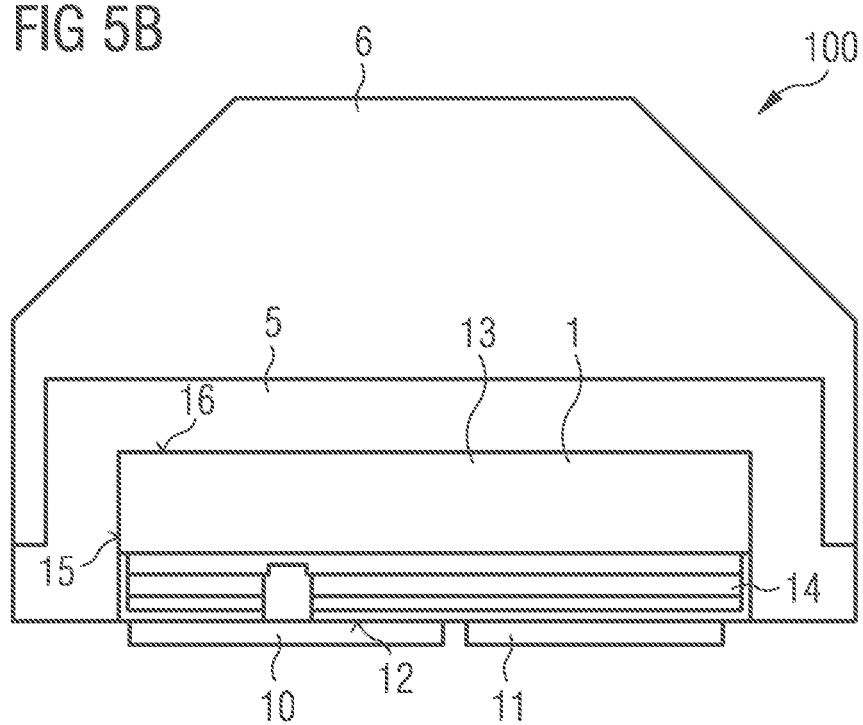

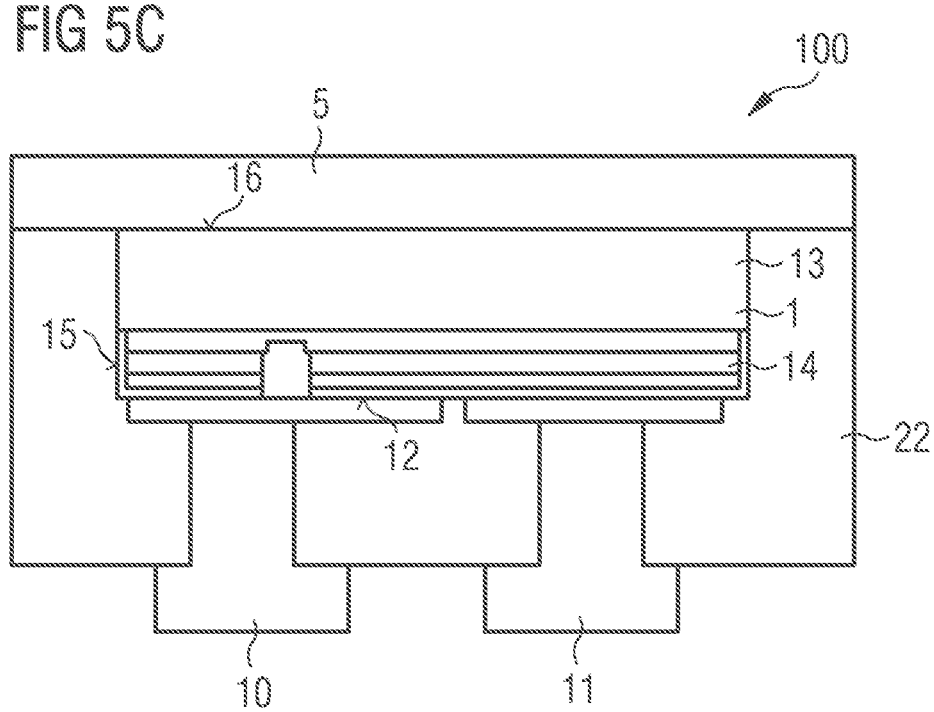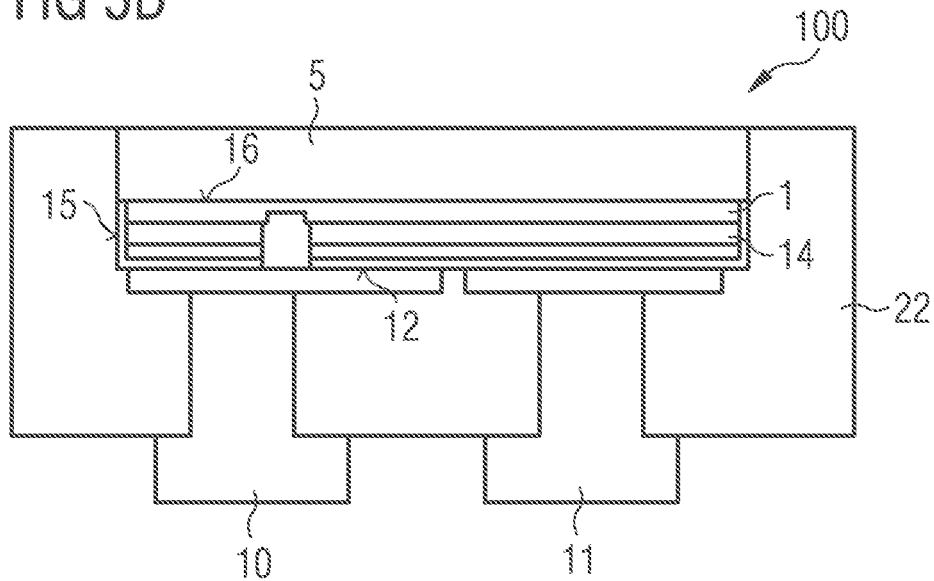

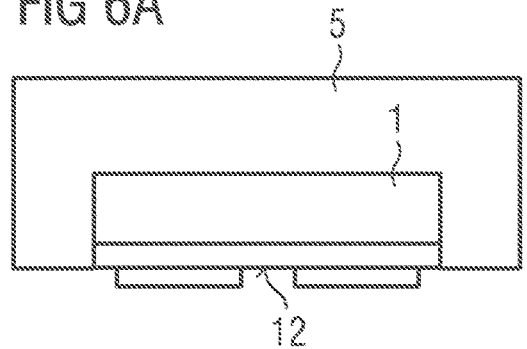
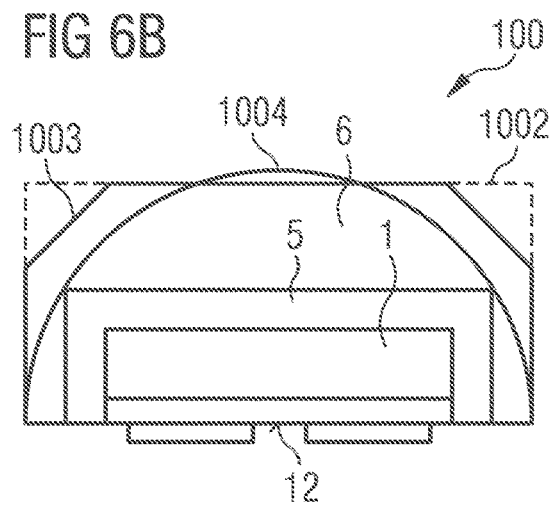
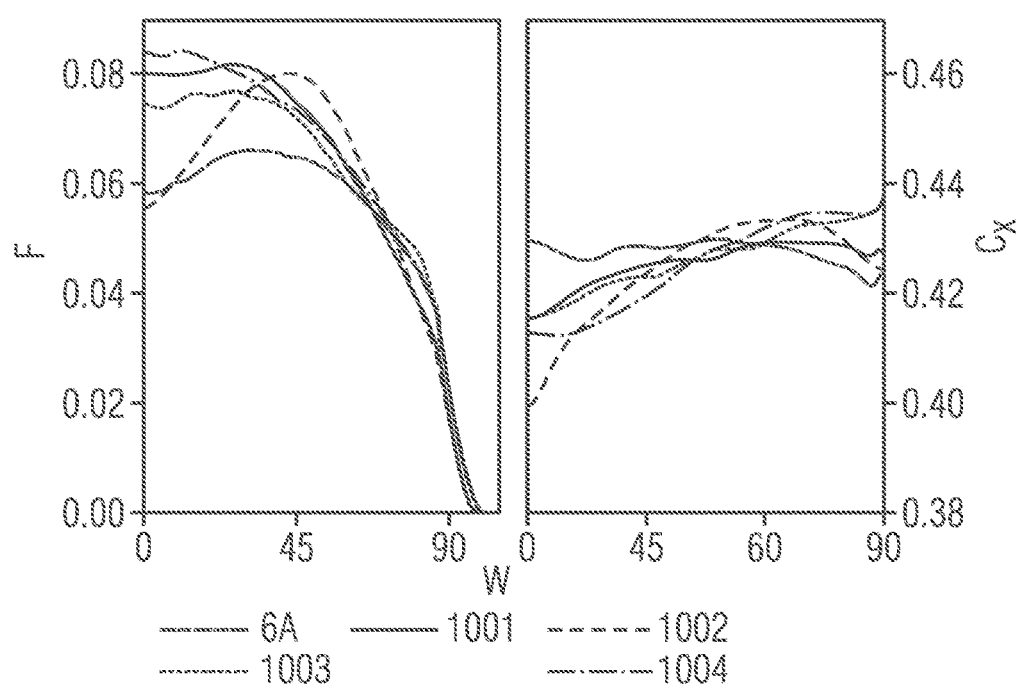

US 10,243,117 B2

METHOD FOR PRODUCING OPTOELECTRONIC DEVICES AND SURFACE-MOUNTABLE OPTOELECTRONIC DEVICE

This patent application is a national phase filing under section 371 of PCT/EP2016/060590, filed May 11, 2016, which claims the priority of German patent application 10 2015 107 586.5, filed May 13, 2015, each of which is incorporated herein by reference in its entirety.

TECHNICAL FIELD

A method is provided for producing optoelectronic devices. A surface-mountable optoelectronic device is also provided.

BACKGROUND

A method for applying a converter layer on a semiconductor chip is known, for example, from document WO 2014/001149 A1.

SUMMARY OF THE INVENTION

Embodiments provide a method for producing optoelectronic devices with which a converter layer is uniformly applied to semiconductor chips. Further embodiments provide an optoelectronic device which has a uniform converter layer.

According to at least one embodiment, the method for producing optoelectronic devices comprises a step A), in which a carrier and a plurality of optoelectronic semiconductor chips are provided. The carrier may, for example, be a metal carrier or glass carrier or semiconductor carrier or a plastics carrier. The carrier may, however, also be a potting material in which the semiconductor chips are embedded.

Each semiconductor chip comprises contact elements for external electrical contacting. The contact elements are arranged on a contact side of the semiconductor chip. All the contact elements which are required for externally contacting the semiconductor chip are preferably arranged on one side of the semiconductor chip, namely the contact side. In particular, in the unmounted state of the semiconductor chip, the contact elements are freely accessible. The contact elements, for example, project out from the contact side.

According to at least one embodiment, the method comprises a step B) in which the semiconductor chips are applied laterally adjacent one another on the carrier. The lateral direction is here determined by the main direction of extension of the carrier. The semiconductor chips are here preferably applied in such a manner that the contact sides in each case face the carrier. After application, the contact elements are thus preferably covered by the carrier.

In step B), the contact elements are particularly preferably surrounded laterally, i.e., in the direction parallel to the main direction of extension of the carrier, by one or more protective elements. The protective elements may be applied to the carrier or already be part of the carrier before step B). The protective elements may be brought into direct contact with the contact elements or, after application of the semiconductor chips, be laterally spaced from the contact elements.

According to at least one embodiment, the method comprises a step C) in which an electrically conductive layer is applied to at least sub-regions of the sides of the semiconductor chips not covered by the carrier. For example, all the sides of the semiconductor chips which are not concealed by the carrier are concealed or covered by the electrically conductive layer. Alternatively, however, only a radiation side, opposite the contact side, of each semiconductor chip may be concealed by the electrically conductive layer. Side faces of the semiconductor chips which extend transversely of the contact side then remain free of the electrically conductive layer. The radiation side is here, for example, an outer side, for instance a major side, of the semiconductor chip, via which, during operation, some or a major part of the radiation generated in the semiconductor chip is coupled out of the semiconductor chip.

The electrically conductive layer preferably completely and/or form-fittingly conceals the corresponding sides of the semiconductor chips. The electrically conductive layer is particularly preferably formed contiguously, continuously and uninterruptedly on the carrier and on the semiconductor chips. The electrically conductive layer on the plurality of semiconductor chips is then a single layer. In particular, the electrically conductive layer is applied directly onto the semiconductor chips and is thus then in direct contact with the semiconductor chips. In this case, no further layers are applied onto the semiconductor chips beforehand.

The protective element(s) in step C) particularly preferably prevent direct contact of the contact elements with the electrically conductive layer. The protective elements are thus arranged around the contact elements in such a manner that, on application of the electrically conductive layer, the latter does not reach as far as the contact elements.

The electrically conductive layer may be applied, for example, by way of a sputtering method or by way of vapor deposition or by way of atomic layer deposition (ALD) or chemical vapor deposition (CVD), or physical vapor deposition (PVD).

The thickness of the electrically conductive layer amounts, for example, to at least 20 nm or 100 nm or 300 nm. Alternatively or in addition, the thickness of the electrically conductive layer is at most 2 µm or 1 µm or 500 nm. The thickness of the electrically conductive layer is here preferably taken to mean the maximum or average or minimum thickness along the entire extent of the electrically conductive layer.

According to at least one embodiment, in a step D) a converter layer is deposited electrophoretically on the electrically conductive layer, in particular deposited directly and/or form-fittingly on the electrically conductive layer. The converter layer is designed, in correct operation, to convert at least a proportion of the radiation emitted by the semiconductor chips into radiation of another wavelength range.

In operation, the semiconductor chips, for example, emit visible light between 400 nm and 800 nm inclusive or light in the UV range between 200 nm and 400 nm inclusive. The converter layer converts the radiation emitted by the semiconductor chip, for example, into visible light, such as red and/or yellow and/or green and/or blue light. In particular, it is conceivable for the converter layer to bring about a full conversion of the radiation emitted from the semiconductor chips.

For the purpose of electrophoretic deposition of the converter layer, the carrier with the semiconductor chips is, for example, immersed in an electrophoresis bath which is, for example, combined with organic solvents and converter particles. By applying an electrical voltage to the electrophoresis bath, the converter particles to be deposited migrate to the electrically conductive layer, where they are deposited. The converter layer, which is preferably in direct contact with the electrically conductive layer, is formed in this manner.

In particular, the converter layer deposited by the electrophoresis method is formed contiguously, continuously and uninterruptedly on the electrically conductive layer. The converter layer may thus likewise partially or completely cover all the sides of the semiconductor chips which are not concealed by the carrier.

Examples of suitable materials for the converter particles of the converter layer are garnets, such as $(Y,Lu,Gd,Tb)_3(Al_{1-x},Ga_x)_5O_{12}:Ce^{3+}$ or doped silicon nitrides, such as $(Ca,Ba,Sr)_2Si_5N^8:Eu^{2+}$, or doped silicon aluminum nitrides, such as $(Ca,Sr)AlSiN_3:Eu^{2+}$ or $Sr(Ca,Sr)Si_2Al_2N_6:Eu^{2+}$ or $(Sr,Ca)AlSiN_3*Si_2N_2O:Eu^{2+}$ or $(Ca,Sr)Al_{(1-4x/3)}Si_{(1+x)}N_3$:Ce (x=0.2-0.5), or silicon oxynitrides, such as $(Ba,Sr,Ca)Si_2O_2N_2:Eu^{2+}$ or $AE_{2-x-a}RE_xEu_aSi_{1-y}O_{4-x-2y}N_x$ or $AE_{2-x-a}RE_xEu_aSi_{1-y}O_{4-x-2y}N_y$, or doped silicon oxides, such as $(Ba,Sr,Ca)_2SiO_4:Eu^{2+}$ or $Ca_8Mg(SiO_4)_4Cl_2:Eu^{2+}$, wherein AE is an alkaline earth metal and RE a rare earth metal.

The converter particles have, for example, grain sizes of at least 100 nm or 1 μm or 10 μm. Alternatively or additionally, the grain sizes are at most 50 μm or 20 μm or 1 μm.

In addition to the converter layer, it is also possible for further layers, for example, comprising materials for light scattering and/or coloring pigments, to be deposited, in particular electrophoretically deposited, on the electrically conductive layer. Materials for light scattering and/or coloring pigments may also be deposited together with the converter particles in a common electrophoresis process.

Thin layer stacks with a total thickness of up to 70 μm may be deposited by means of electrophoretic deposition. Further layers with different conversion properties may here be deposited on a conversion layer, resulting in spatially separate layers with different functions. For example, further conversion layers which emit electromagnetic radiation of a shorter wavelength range may be arranged downstream of a conversion layer which emits electromagnetic radiation in the red wavelength range. This advantageously reduces the risk of the radiation in the red wavelength range being absorbed in the downstream layers. This improves the efficiency and heat dissipation of the optoelectronic device.

According to at least one embodiment, the electrically conductive layer is removed from regions between the converter layer and the semiconductor chips in a step E). Removal may proceed, for example, by means of a protic reactant and/or a solvent. As a result, the electrically conductive layer beneath the converter layer is structurally modified and/or dissolved away. In particular, dissolution or structural modification of the electrically conductive layer ensures that at least 90% or 95% or 99% of the electromagnetic radiation exiting from the semiconductor chip reaches the converter layer. Removal preferably reduces or eliminates any previously present radiation-absorbing effect of the electrically conductive layer.

Each optoelectronic device produced using this method then, for example, comprises precisely one semiconductor chip with the converter layer applied thereon.

In at least one embodiment, the method for producing optoelectronic devices comprises a step A) in which a carrier and a plurality of optoelectronic semiconductor chips are provided, wherein each semiconductor chip has contact elements, arranged on a contact side of the semiconductor chip, for external electrical contacting. In a step B), the semiconductor chips are applied laterally adjacent one another on the carrier, wherein the contact sides face the carrier on application. In a step C), an electrically conductive layer is applied to at least sub-regions of the sides of the semiconductor chips not covered by the carrier, wherein the electrically conductive layer is formed contiguously. In a step D), a converter layer is electrophoretically deposited on the electrically conductive layer, wherein, in correct operation, the converter layer is designed to convert at least a proportion of radiation emitted by the semiconductor chips into radiation of another wavelength range. The electrically conductive layer is removed from regions between the converter layer and the semiconductor chips in a step E).

The invention described here is in particular based on the concept of covering semiconductor chips with a converter element in the form of a thin converter layer by means of an electrophoretic method. The thin converter layer improves the thermal characteristics of the finished devices in comparison with devices with thick converter elements. In particular, the semiconductor chips or converter elements undergo less severe heating, whereby typical thermal effects, such as discoloration and cracking in the converter element or a color coordinate shift or drops in efficiency, may be reduced. Moreover, a thin converter layer has the advantage, for example, over a thick converter potting compound that less radiation is emitted towards the back face, for example, towards a connection carrier.

According to at least one embodiment, steps A) to E) are carried out in the stated sequence in succession and/or mutually independently and/or in separate steps.

According to at least one embodiment, a bonding layer is applied to the carrier. During application in step B), the contact elements are, for example, pressed so deeply into the bonding layer that in step C) the contact elements are protected from being covered with the electrically conductive layer and thus from the risk of short circuit. The contact elements are to this end, for example, pressed completely into the bonding layer. The bonding layer is thus preferably deformable and/or resilient. In the present case, the protective element or protective elements are, for example, then formed by the bonding layer.

In particular, the bonding layer extends continuously and contiguously along the carrier and has no interruptions between the semiconductor chips or in the region of the semiconductor chips. The bonding layer has, for example, a thickness of at least 2 μm or 5 μm or 10 μm. Alternatively or additionally, the bonding layer has a thickness of at most 30 μm or 20 μm or 15 μm.

According to at least one embodiment, the bonding layer comprises or consists of a thermoplastic material. Thermoplastics are in particular plastics which can be deformed in a specific temperature range. In order to apply the semiconductor chips to the carrier, the bonding layer may thus preferably be adjusted to an appropriate temperature for it to be possible to press the contact elements into the bonding layer. The inventors have discovered that bonding layers, for example, made of thermoplastic materials also provide the contact elements with particularly good protection from in particular wet chemical processes.

According to at least one embodiment, the semiconductor chips are detached from the carrier after step E), for example, by appropriate heating of the bonding layer or the carrier. The semiconductor chips with the converter layer may be singulated before or after detachment from the carrier. Individual optoelectronic devices are produced in this manner. The semiconductor chip contact elements are preferably uncovered and freely accessible in the finished devices.

In particular, after detachment from the carrier and singulation, the devices are mechanically self-supporting and robust even without further potting materials. The dimensions of the optoelectronic devices are preferably adapted to the dimensions of the semiconductor chips, i.e., the lateral and/or vertical dimensions thereof deviate by less than 10% or 5% from the corresponding dimensions of the semiconductor chips.

According to at least one embodiment, after steps C) or D), the electrically conductive layer and/or the converter layer at least 90% or 95% or 99% or completely conceal the sides of the semiconductor chips not covered by the carrier.

According to at least one embodiment, the carrier is a potting material in which the semiconductor chips are embedded. In this case, step A), in which the carrier and the semiconductor chips are provided, coincides with step B), in which the semiconductor chips are arranged on the carrier. The potting material, for example, comprises or consists of a polymer or an acrylate or an Ormocer or an epoxy resin or a photoresist or a plastic, such as a white plastic. A silicone or resin with titanium dioxide particles incorporated therein is, for example, possible here. The potting material is then not subsequently detached from the semiconductor chips and is thus part of the finished optoelectronic devices.

According to at least one embodiment, after steps A) and B), the semiconductor chips are embedded in the potting material in such a manner that the contact sides are completely covered by the carrier. The semiconductor chip side faces which extend transversely of the contact side are partially or completely covered by the potting material. The radiation side, opposite the contact side, of each semiconductor chip is partially or completely free of the potting material. In particular, the semiconductor chip and the potting material then terminate flush with one another on the radiation side.

Embedding the semiconductor chips in the carrier or the potting material may, for example, proceed by initially arranging the semiconductor chips on an auxiliary carrier with the radiation sides facing towards the auxiliary carrier. Then, the semiconductor chips have the potting material poured over them and are completely encapsulated. After detachment of the auxiliary carrier, the radiation sides are then, for example, uncovered.

According to at least one embodiment, the assembly of potting material and semiconductor chips is self-supporting after steps A) and B). This means in particular that the assembly is also mechanically stable without any further carrier. A prior curing process for the potting material may be necessary to achieve this.

According to at least one embodiment, after step E) holes are introduced into the potting material, through which holes the contact elements previously concealed by the potting material can be electrically contacted.

In the present case, the potting material, for example, forms the protective element(s) around the contact elements.

According to at least one embodiment, before step C) a potting compound is introduced between the semiconductor chips. In particular, spaces located between two adjacent semiconductor chips are filled in with the potting compound. Before the spaces are filled in, the carrier may be uncovered therein. The potting compound is, for example, a potting material as mentioned above, with which the spaces may be partially or completely filled in. The potting compound is here preferably arranged around the semiconductor chips such that at least in each case one or all of the side faces of the semiconductor chips are each partially, for instance to an extent of at least 90% or 95%, or completed covered or encapsulated by the potting compound. The radiation sides of the semiconductor chips here in each case remain partially or completely free of potting compound.

According to at least one embodiment, in step C) the electrically conductive layer is also applied onto the potting compound located between the semiconductor chips. The electrically conductive layer may then also be removed from regions between the converter layer and the potting compound in step E).

According to at least one embodiment, the electrically conductive layer is removed by means of a wet chemical process in step E).

According to at least one embodiment, the electrically conductive layer comprises or consists of at least one metal or metal alloy. Possible metals are, for example: Al, Ag, Au, Ti, Pt, Li, Na, Ka, Ru, Cs, Be, Ca, Mg, Sr, Ba, Sc, Si, Ga, Sn. It is, however, also possible for the electrically conductive layer to comprise or consist of a transparent conductive material, such as ITO or ZnO.

According to at least one embodiment, the metal of the electrically conductive layer is partially or completely converted by chemical reaction into a salt of the metal in step E). To this end, the electrically conductive layer may, for example, be brought into contact with a protic reactant and then washed away with a solvent. Such a method is known, for example, from document WO 2014/001149 A1.

According to at least one embodiment, after step E) the mole fraction of the salt in the converter layer is at least 0.001% or 0.01% or 0.1%. Alternatively or additionally, the mole fraction of the salt amounts to at most 2% or at most 1% or 0.5%. The salt may here actually be distributed within the converter layer and/or form a separate layer beneath the converter layer. In the latter case, this separate layer is, for example, considered to be part of the converter layer.

According to at least one embodiment, after the deposition process in step D) the converter layer has a uniform layer thickness, with maximum thickness fluctuations of 20% or 10% or 5% or 3% or 1% about a mean layer thickness. The mean layer thickness is determined, for example, along the entire extent of the converter layer. Such a uniform layer thickness makes it possible to achieve particularly high color location uniformity along an entire radiation exit face of the semiconductor chips.

According to at least one embodiment, after step E) the layer thickness of the converter layer amounts to at most 70 μm or 50 μm or 30 μm. Alternatively or additionally, after step E) the layer thickness amounts to at least 10 μm or 20 μm or 30 μm. Layer thickness is here taken to mean, for example, the maximum or mean layer thickness of the converter layer.

According to at least one embodiment, after step E) the converter layer extends continuously, contiguously and uninterruptedly on the semiconductor chips. In particular, even after any singulation process of the semiconductor chips, the converter layer is formed continuously, contiguously and uninterruptedly on each individual semiconductor chip.

According to at least one embodiment, the converter layer is formed from a powder of converter particles. The converter layer is thus free of a binder, such as a silicone or a resin, which binds individual converter particles together. The mole fraction of the converter particles in the converter layer is preferably at least 90% or 95% or 99%. The converter layer in itself is, for example, porous and/or crumbly and/or fragile and/or mechanical unstable. In particular, the converter layer is not ceramic and/or not sintered. The converter layer may, for example, at least temporarily be held in dimensionally stable manner on the semiconductor chip by van der Waals forces.

According to at least one embodiment, after step E) the converter layer is surrounded, for example, form-fittingly, with an encapsulation layer. The encapsulation layer may be in direct contact with the converter layer and preferably prevents subsequent flaking or crumbling or detachment of the converter layer from the semiconductor chips. This is in particular advantageous because the converter layer preferably consists of a powder of converter particles. The encapsulation layer, for example, comprises or consists of a silicone or parylene or resin. The layer thickness of the encapsulation layer on the converter layer amounts, for example, to at least 100 nm or 500 nm or 1 µm. Alternatively or additionally, the layer thickness of the encapsulation layer is at most 500 µm or 300 µm or 100 µm. In particular, the encapsulation layer may also be a potting compound, for example, a silicone potting compound, which is applied to the semiconductor chip with the converter layer.

It is, however, also possible additionally to arrange a thin fixing layer between the encapsulation layer and the converter layer to fix the converter particles or converter layer to the semiconductor chips. The fixing layer is, for example, based on a polymer and has a thickness of between 100 nm and 1 µm inclusive.

According to at least one embodiment, the encapsulation layer comprises or consists of a transparent material. In particular, the transparent material is at least 80% or 90% or 95% transmissive to the radiation emitted by the semiconductor chip and/or by the converter element.

According to at least one embodiment, after step E) the encapsulation layer is patterned in such a manner that, in the finished device, the patterned encapsulation layer acts as a lens for the radiation emitted by the respective semiconductor chip. In particular, the encapsulation layer may, for example, be applied simultaneously, for example, as a potting compound, onto all the semiconductor chips and the carrier. The encapsulation layer may then be removed again in regions between the semiconductor chips and, for example, be formed into individual lenses over the respective semiconductor chips. Alternatively, it is however also possible to singulate the semiconductor chips through the encapsulation layer and only subsequently to pattern the encapsulation layer for each resultant device, for example, by grinding away edges of the encapsulation layer.

According to at least one embodiment, the carrier is a printed circuit board, to which the semiconductor chips can be electrically connected and permanently mechanically fastened in step B). If such a printed circuit board is used as carrier, the carrier preferably remains on the semiconductor chips and is thus not detached from the semiconductor chips according to step E). The printed circuit board may, for example, be an active matrix element by way of which the individual semiconductor chips can be individually and mutually independently driven.

According to at least one embodiment, a protective frame, for example, made from a plastics material resistant to wet chemical processes, is applied to the carrier for each semiconductor chip. During application in step B), the semiconductor chips are then preferably placed on the carrier in such manner that the contact elements are partially or completely surrounded by the corresponding protective frame. In particular, the protective frame should prevent the contact elements from being covered with the electrically conductive layer in step C). The protective frames then thus in particular form the above-stated protective elements.

According to at least one embodiment, the semiconductor chips are "volume emitters" with a growth substrate and a semiconductor layer sequence grown on the growth substrate. The growth substrate here simultaneously forms the stabilizing component in the semiconductor chip; no further stabilizing measures are then necessary. The growth substrate may, for example, comprise or consist of sapphire or silicon or germanium or SiC or GaN. The semiconductor layer sequence is based, for example, on a III-V compound semiconductor material, in particular on AlInGaN or AlGaAs. The semiconductor layer sequence preferably moreover comprises an active layer which comprises at least one pn junction and/or a quantum well structure.

According to at least one embodiment, the contact elements are arranged on a side of the semiconductor layer sequence remote from the growth substrate. The semiconductor chips may thus be "flip chips", in particular sapphire flip chips.

According to at least one embodiment, the semiconductor chips are in each case thin-film semiconductor chips with a substrate which stabilizes the semiconductor chip and a semiconductor layer sequence applied to the substrate. The substrate here differs from the growth substrate of the semiconductor layer sequence, and the growth substrate is removed. The substrate itself then, for example, alone forms the stabilizing component of the semiconductor chip, without any residues of a growth substrate contributing or needing to contribute to stabilization. The contact elements are in this case preferably applied to a side of the substrate remote from the semiconductor layer sequence.

A surface-mountable optoelectronic device is also provided. The optoelectronic device may in particular be produced using the method described here. In other words, all features disclosed in relation to the device are also disclosed for the method and vice versa.

According to at least one embodiment, the surface-mountable optoelectronic device comprises an optoelectronic semiconductor chip with uncovered contact elements for external electrical contacting of the device. The contact elements are here arranged on a common contact side of the semiconductor chip.

According to at least one embodiment, a continuously, contiguously and uninterruptedly formed converter layer is applied to a radiation side of the semiconductor chip opposite the contact side. Additionally, however, the converter layer may also be applied, extending continuously, contiguously and uninterruptedly, to side faces, in particular to all side faces, of the semiconductor chip which extend transversely of the contact side. The radiation side and/or the side faces of the semiconductor chip are then concealed by the converter layer to an extent of at least 90%. The converter layer is, for example, here in direct contact with the semiconductor chip.

According to at least one embodiment, an encapsulation layer is applied to the converter layer and completely covers and encloses the converter layer. In particular, the encapsulation layer surrounds the converter layer form-fittingly and/or is in direct contact with the converter layer.

According to at least one embodiment, the converter layer is designed, in correct operation of the device, to convert at least a proportion of the radiation emitted by the semiconductor chip into radiation of another wavelength range.

According to at least one embodiment, the converter layer has a uniform layer thickness along the entire lateral extent thereof on the semiconductor chip, with maximum thickness fluctuations of 5% about a mean layer thickness.

According to at least one embodiment, the layer thickness of the converter layer is at most 70 µm.

According to at least one embodiment, the converter layer is a powder of converter particles which is held on the semiconductor chip by the encapsulation layer.

According to at least one embodiment, the semiconductor chip is embedded in a potting material. The potting material here partially or completely covers all the side faces of the semiconductor chip which extend transversely of the contact side. The potting material preferably extends contiguously, continuously and uninterruptedly around the semiconductor chip. The side faces of the semiconductor chip are then at most partially or not at all concealed by the converter layer. The potting material may be in direct contact with the side faces of the semiconductor chip.

The thickness of the potting material on the side faces amounts, for example, to at least 1 µm or at least 5 µm or at least 10 µm. Alternatively or additionally, the thickness of the potting material amounts to at most 100 µm or at most 50 µm or at most 10 µm.

According to at least one embodiment, the converter layer is arranged in places on the potting material and, in the lateral direction parallel to the contact side, terminates flush with the potting material. In other words, in plan view onto the radiation side of the device, the converter layer congruently conceals the semiconductor chip and the potting material extending around the semiconductor chip.

According to at least one embodiment, the converter layer is surrounded, in particular completely surrounded, by the potting material in the lateral direction parallel to the contact side. The converter layer is then embedded in the potting material and is uncovered, for example, only on a side remote from the radiation side. In this case, the potting material and the converter layer terminate flush with one another in the direction away from the radiation side.

According to at least one embodiment, the converter layer comprises a salt of a metal, the mole fraction of which in the converter layer amounts to between 0.001% and 2% inclusive.

According to at least one embodiment, the encapsulation layer is a transparent silicone potting compound. The silicone potting compound has, for example, a layer thickness of between 100 µm and 500 µm inclusive. The silicone potting compound furthermore preferably comprises beveled edges on a side of the device remote from the contact side. The beveled edges may here, for example, act as a lens for the light emitted by the semiconductor chip.

BRIEF DESCRIPTION OF THE DRAWINGS

A method described here for producing optoelectronic devices and a surface-mountable optoelectronic device described here are explained in greater detail below on the basis of exemplary embodiments with reference to drawings. Elements which are the same in the individual figures are indicated with the same reference numerals. The relationships between the elements are not shown to scale; but rather individual elements may be shown exaggeratedly large to assist in understanding.

In the figures:

FIGS. 1A to 1H, FIG. 2, FIGS. 3A to 3B and FIGS. 4A to 4C show cross-sectional views of various method steps for producing exemplary embodiments of optoelectronic devices;

FIGS. 5A to 5D show exemplary embodiments of a surface-mountable optoelectronic device in cross-sectional view; and FIGS. 6A to 6E show optoelectronic devices from the prior art and according to exemplary embodiments of the invention described here, and graphs of the radiation characteristics of the various devices.

DETAILED DESCRIPTION OF ILLUSTRATIVE EMBODIMENTS

Figure 1E:
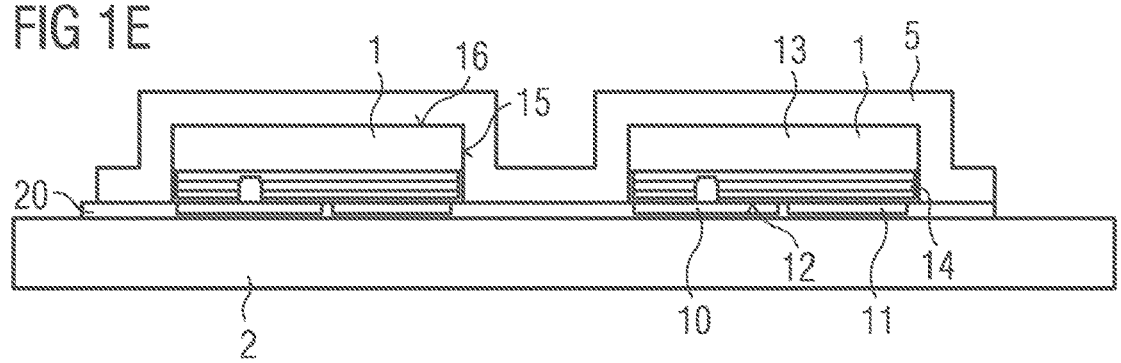

FIG. 1A shows a first method step for producing exemplary embodiments of optoelectronic devices 100. A carrier 2, for example, a glass carrier, and semiconductor chips 1 are provided. The semiconductor chips 1 comprise a substrate 13 and a semiconductor layer sequence 14 applied thereon. The substrate 13, for example, comprise a growth substrate for the semiconductor layer sequence 14. The substrate 13 is, for example, a sapphire substrate, on which an AlInGaN semiconductor layer sequence 14 is grown.

A side of the semiconductor layer sequence 14 remote from the growth substrate 13 takes the form of a contact side 12, on which contact elements 10, 11 for external electrical contacting of the semiconductor layer sequence 14 or semiconductor chip 1 are applied. A side of the semiconductor chip 1 remote from the contact side 12 takes the form of a radiation side 16, via which, in operation, at least a proportion of the radiation generated in the semiconductor chip 1 is coupled out. The radiation side 16 and the contact side 12 are connected together via side faces 15 of the semiconductor chip 1 which extend transversely of the contact side 12.

In the method step of FIG. 1A, the semiconductor chips 1 are applied to the carrier 2, wherein the contact sides 12 face the carrier 2. A continuous, contiguous bonding layer 20, for example, consisting of a thermoplastic material, is moreover applied to the carrier 2.

In the method step shown in FIG. 1B, the semiconductor chips 1 are arranged laterally adjacent one another on the carrier 2, wherein the contact elements 10, 11 are pressed into, in particular completely pressed into, the bonding layer 20 and embedded in the bonding layer 20. In this manner, the contact elements 10, 11 are protected by the bonding layer 20 from influences from further method steps. For example, the semiconductor chips 1 were pressed in so far that the growth substrate 13 touches the bonding layer 20. To this end, the bonding layer 20 and/or the carrier 2 and/or the semiconductor chips 1 were, for example, heated to a specific temperature, at which the semiconductor chips 1 can be pressed into the bonding layer 20. In the present case, the carrier 2 was heated to approx. 80° C. and the semiconductor chips 1 to approx. 200° C.

It is moreover apparent from FIG. 1B that the semiconductor chips 1 are laterally spaced apart from one another, i.e., interspaces, in which the carrier 2 or bonding layer 20 are uncovered, are formed between the semiconductor chips 1.

The method step of FIG. 1C shows how an electrically conductive layer 4, for example, made of a metal, such as Al or Ag, is applied form-fittingly and directly to the semiconductor chips 1 and the carrier 2. The electrically conductive layer 4 is here applied as a continuous, contiguous and uninterrupted layer which covers all the sides of the semiconductor chip 1 which are not concealed by the carrier 2, i.e., in the present case the radiation side 16 and the side faces 15. The regions of the carrier 2 between the semiconductor chips 1 are covered by the electrically conductive layer 4. The electrically conductive layer 4 may, for example, be applied by way of a sputtering method or by way of evaporation or by way of atomic layer deposition. In the present case, the electrically conductive layer 4 has, for example, a layer thickness of between 20 nm and 2 µm inclusive.

FIG. 1D shows a further method step in which a converter layer 5 is deposited directly and form-fittingly onto the electrically conductive layer 4. The converter layer 5 is here deposited by way of an electrophoresis method, as for example, described in document WO 2014/001149 A1. In the present case, the converter layer 5, like the electrically conductive layer 4, is formed continuously, contiguously and uninterruptedly and covers all the sides of the semiconductor chip 1 which are not concealed by the carrier 2. The regions of the carrier 2 between the semiconductor chips 1 are completely covered by the converter layer 5. The converter layer 5 is here preferably formed from a powder of converter particles and thus contains no bonding agent. The layer thickness of the converter layer is moreover preferably at most 70 µm.

FIG. 1E shows a further method step in which the electrically conductive layer 4 arranged between the semiconductor chips 1 and the converter layer 5 has been removed. Removal may, for example, proceed by way of a wet chemical process, wherein the metal of the electrically conductive layer 4 is converted into a salt of the metal. The salt may moreover at least in part be removed from the converter layer 5 by a solvent.

Figure 1F:
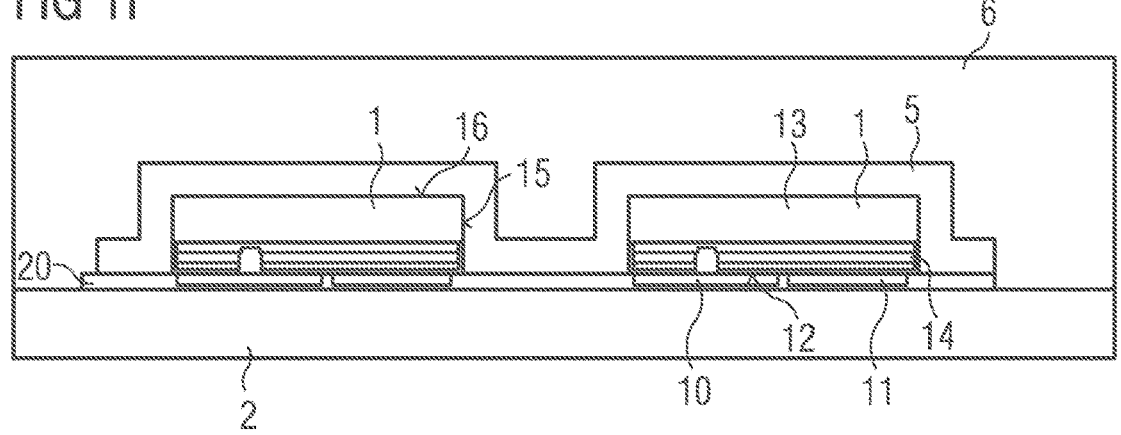

In the method step of FIG. 1F, an encapsulation layer 6 in the form of a potting compound is applied to the semiconductor chips 1 and the carrier 2, which encapsulation layer completely encloses the semiconductor chips 1 on all the sides not covered by the carrier 2. The layer thickness of the encapsulation layer 6 on the semiconductor chips 1 amounts, for example, to between 100 µm and 300 µm inclusive. The encapsulation layer 6 is here preferably clear or transparent to electromagnetic radiation emitted by the semiconductor chips 1 or the converter layer 5. In the present case, the encapsulation layer 6, for example, comprises or consists of a transparent silicone. It is also possible for further converter particles for light conversion to be introduced into, for example, uniformly distributed in, the encapsulation layer 6.

Figure 1G:
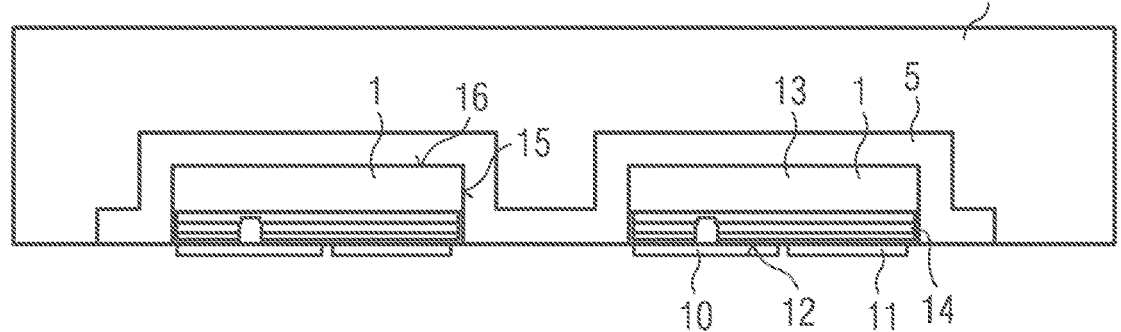

In the method step of FIG. 1G, the carrier 2 with the bonding layer 20 has been detached from the semiconductor chips 1 embedded in the encapsulation layer 6. This may again proceed, for example, by heating the bonding layer 20 or with the assistance of laser radiation or by a shearing method.

Figure 1H:
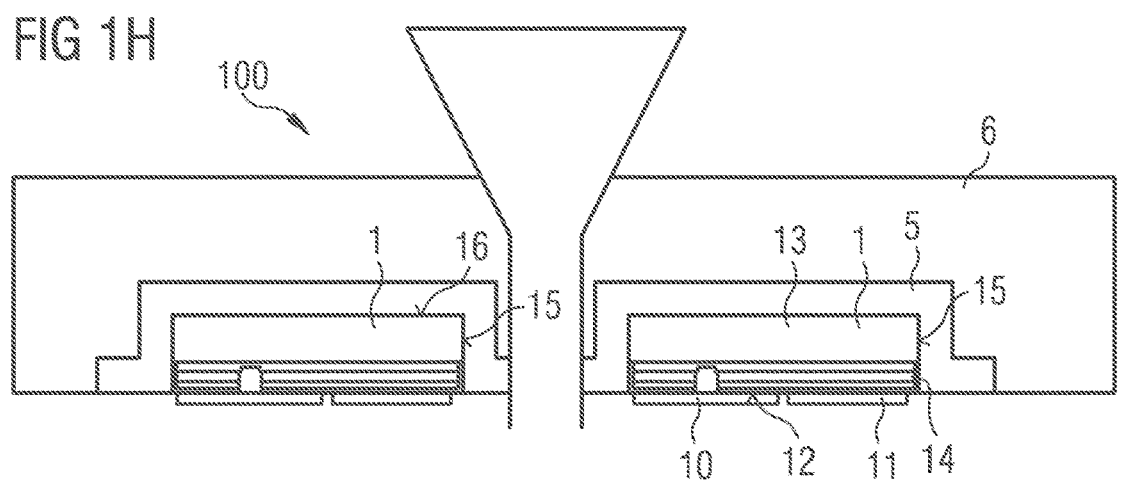

The method step of FIG. 1H shows how the semiconductor chips 1 are singulated. The encapsulation layer 6 and the converter layer 5 are here diced in regions between the semiconductor chips 1, whereby individual surface-mountable optoelectronic devices 100 are obtained. The devices 100 are here self-supporting; no further carrier is thus required for stabilizing the devices 100. In the finished devices 100, the contact elements 10, 11 are uncovered and are concealed by neither the converter layer 5 nor the encapsulation layer 6. Since both contact elements 10, 11, in particular all the contact elements of the semiconductor chips 1, are uncovered on one side of the devices 100, the devices 100 are surface-mountable.

The devices 100 of FIG. 1H have, for example, lateral dimensions of 1.2×1.2 mm², wherein the semiconductor chips 1 themselves have lateral dimensions of, for example, 1015×1015 µm².

Figure 2:
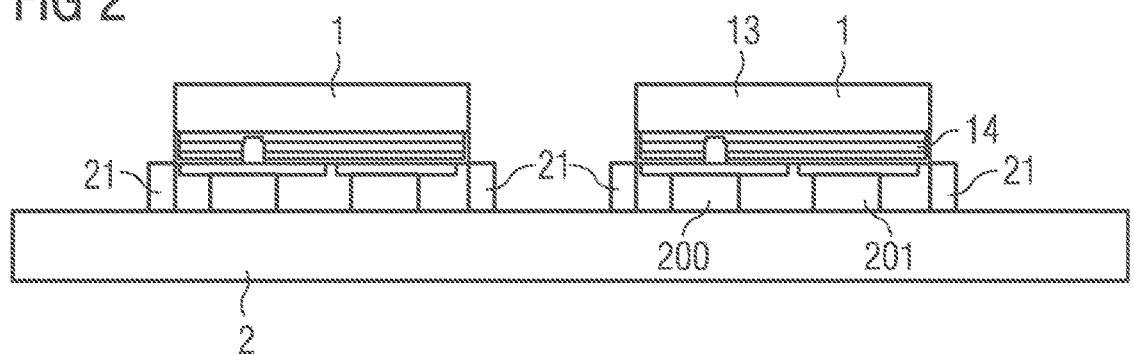

The exemplary embodiment of FIG. 2 shows an alternative method step which substantially corresponds to the method step of FIG. 1B. In contrast with FIG. 1B, however, no bonding layer 20 has been applied to the carrier 2, the carrier 2 in FIG. 2 instead comprising a protective frame 21, for example, based on a plastics material, for each semiconductor chip 1. The protective frame 21 here performs substantially the same task as the bonding layer 20 and is intended to protect the contact elements 10, 11 during further method steps.

In FIG. 2, the carrier 2 moreover takes the form of a printed circuit board on which are formed connection regions 200, 201. The connection regions 200, 201 are here electrically conductively connected to the contact elements 10, 11, such that the semiconductor chips 1 are electrically connected by way of the carrier 2. The carrier 2 is, for example, an active matrix element by way of which each semiconductor chip 1 can be individually and mutually independently electrically driven.

Figure 3A:
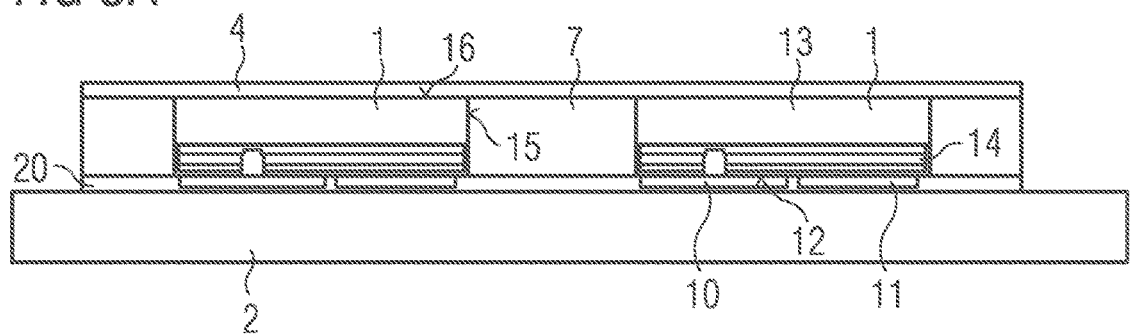

FIG. 3 shows alternative or additional method steps for producing exemplary embodiments of optoelectronic devices 100. In FIG. 3A, the semiconductor chips 1 have been applied to a carrier 2 as in FIG. 1. In addition, the interspaces between the semiconductor chips 1 have been filled in with a potting compound 7, for example, a white plastic. The potting compound 7 here completely and form-fittingly surrounds the semiconductor chips 1. In particular, the side faces 15 of the semiconductor chips 1 are completely covered by the potting compound 7 and are in direct contact with the potting compound 7. The potting compound 7 terminates at the radiation sides 16 flush with the semiconductor chips 1 in a direction away from the carrier 2, wherein the radiation sides 16 themselves are free of potting compound 7. In particular, the radiation sides 16 form, together with the potting compound 7, a planar or flat face over all the semiconductor chips 1.

In FIG. 3A, the method step in which the electrically conductive layer 4 is applied to the semiconductor chips 1 has furthermore already been carried out. In FIG. 3A, the contiguous and uninterrupted electrically conductive layer 4 covers not only the radiation sides 16 of the semiconductor chips 1 but also the potting compound 7 arranged in the interspaces. The side faces 15 of the semiconductor chips 1 are not covered by the electrically conductive layer 4.

Figure 3B:
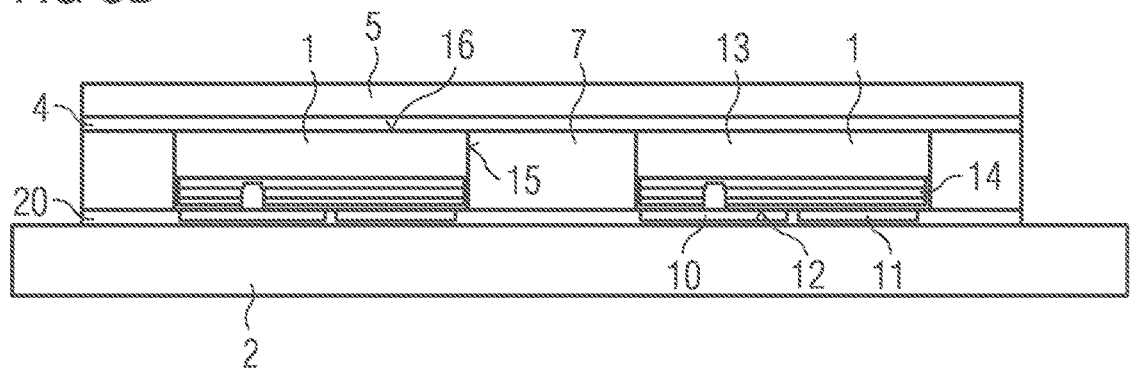

FIG. 3B shows a further method step in which, as in FIG. 1D, the converter layer 5 is applied over the entire surface of the electrically conductive layer 4. The converter layer 5 then likewise covers the radiation sides 16 and the potting compound 7 in the interspaces, but not the side faces 15.

Figure 4A:
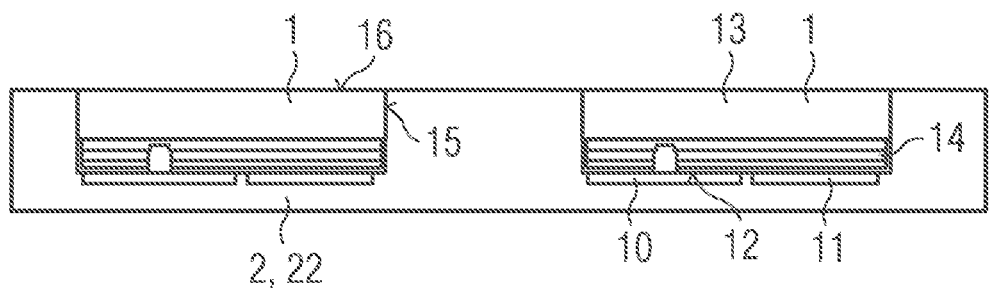

In FIG. 4A, unlike in FIG. 1B, the semiconductor chips 1 have not been applied to a carrier 2 but instead directly potted with the carrier 2. The carrier 2 is then in particular a potting material 22, for example, a plastics material. The semiconductor chips 1 are here embedded in the potting material 22 in such a manner that the side faces 15 and the contact side 12 are in each case concealed or covered by the potting material 22, while the radiation sides 16 are uncovered. The semiconductor chips 1 are here in direct contact with the potting material 22. For example, the thickness of the potting material 22 on the side faces 15, measured perpendicular to the side faces 15, may be between 20 µm and 300 µm. The thickness of the potting material 22 on the contact side 12, measured perpendicular to the contact side 12, may be between 20 µm and 70 µm.

Figure 4B:
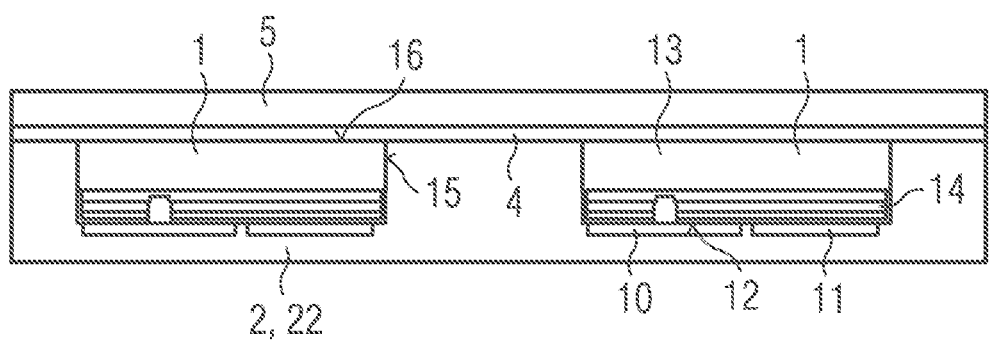

As shown in FIGS. 3A and 3B, in the method step of FIG. 4B the electrically conductive layer 4 and the converter layer 5 are applied to the semiconductor chips 1 and the interposed potting material 22.

Figure 4C:
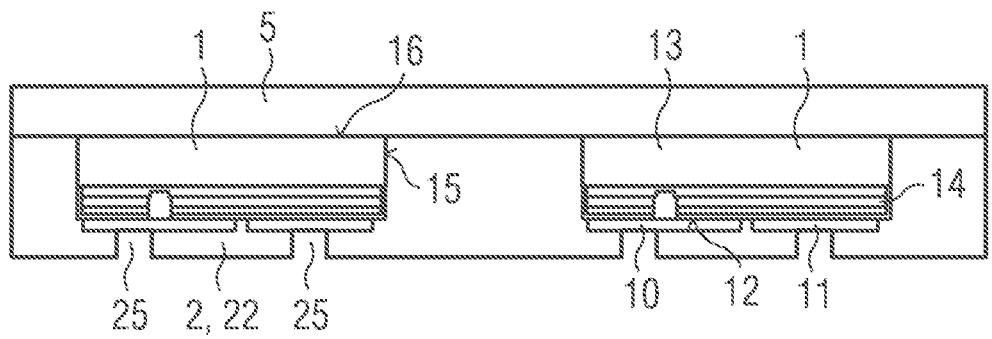

In the method step of FIG. 4C, the electrically conductive layer 4 is removed from regions between the converter layer 5 and the semiconductor chips 1 or potting material 22, for example, by way of a wet chemical process. Moreover, holes 25 are introduced into the potting material 22 from an outer side of the potting material 22 opposite the contact side 12, for example, by means of a laser. By forming the holes 25, the contact elements 10, 11 are uncovered and may then be electrically contacted through the potting material 22 by means of an electrically conductive material. This may be achieved, for example, by an electroplating process.

After the method step shown in FIG. 4C, individual devices 100 may be produced, for example, by dicing the potting material 22 in regions between the semiconductor chips 1.

At variance with what is shown in FIGS. 3 and 4, the radiation sides 16 of the semiconductor chips 1 may also firstly be covered with the electrically conductive layer 4. Only then are the semiconductor chips 1 embedded in the potting material 22 or surrounded by the potting compound 7. Thereafter, the converter layer 5 is applied.

FIG. 5A shows an exemplary embodiment of a surface-mountable optoelectronic device 100 in cross-sectional view. The device 100 here corresponds to the device 100 of FIG. 1H.

The exemplary embodiment of FIG. 5B shows an optoelectronic device boo in which the encapsulation layer 6 has flattened or beveled edges on a side opposite the contact side 12. All the edges of the encapsulation layer 6 opposite the contact side 12 are preferably flattened or beveled. This beveling of the encapsulation layer 6 allows the encapsulation layer 6 to serve as a lens for the radiation emitted by the semiconductor chip 1 or the converter layer 5. The encapsulation layer 6 thus in particular focuses the light emitted by the semiconductor chip 1.

FIG. 5C shows an exemplary embodiment of an optoelectronic device 100 which has been produced using the method steps of FIG. 4. In particular, the contact side 12 and the side faces 15 of the semiconductor chip 1 are encapsulated and covered with the potting material 22. The converter layer 5 covers both the radiation side 16 and the potting material 22 and, in the lateral direction parallel to the radiation side 16, terminates flush with the potting material 22. For example, outer sides of the potting material 22 opposite the side faces 15 comprise traces of physical and/or mechanical material removal which result from a process of singulating the device 100 from the assembly shown in FIG. 4.

Moreover, in FIG. 5C the contact elements 10, 11 take the form of through-vias through the potting material 22 and extend from an outer side of the device 100 to the contact side 12 of the semiconductor chip 1.

In the exemplary embodiment of FIG. 5D, unlike in FIG. 5C, the converter layer 5 is completely surrounded in the lateral direction by the potting material 22. In the direction away from the radiation side 16, the potting material 22 and the converter layer 5 terminate flush with one another and form a planar or flat face.

Moreover, in FIG. 5D the growth substrate 13 of the semiconductor chip 1 has been removed, for example, by way of a laser lift-off process. The semiconductor chip 1 then no longer comprises a stabilizing substrate and, by itself, would be mechanically unstable. The semiconductor chip 1 is mechanically supported and stabilized by the potting material 22.

The semiconductor chips 1 shown in FIGS. 5C and 5D are, however, also mutually interchangeable. That is to say, in both cases the semiconductor chip 1 may comprise a stabilizing substrate or have the stabilizing substrate removed.

FIG. 6A shows a prior art optoelectronic device. A converter element 5 in the form of a potting compound has here been applied to a semiconductor chip 1, wherein the layer thickness of the converter element 5 amounts to at least 100 μm. The converter element 5, for example, comprises phosphor particles in a base material, such as a silicone.

FIG. 6B shows a cross-sectional view of an exemplary embodiment of a surface-mountable optoelectronic device 100 described here. The converter element 5, which completely surrounds the semiconductor chip 1 on all sides of the semiconductor chip 1 remote from the contact side 12, has for example, a thickness of at most 70 μm.

An encapsulation layer 6 in the form of a transparent potting compound, for example, a silicone potting compound, has moreover been applied to the semiconductor chip 1. The encapsulation layer 6 may, as shown in FIG. 6B, be rectangular 1002 or have beveled edges 1003 or be lens-shaped 1004 when viewed in cross section.

FIG. 6C shows the far field emission characteristics of various optoelectronic devices in the form of the radiant intensity F in W/sr and the curves of the color coordinates $C_x$ plotted against angle W in degrees measured relative to a normal of the radiation side 16. The curve designated "6A" here denotes the device of FIG. 6A, while the curves designated 1001, 1002, 1003 and 1004 denote the corresponding devices 100 of FIG. 6B. It is apparent that a thin converter layer thickness both alone (curve 1001) and in combination with an encapsulation layer 6 of lens geometry (curve 1004 and curve 1003) boost emission in the forward direction. On the other hand, thick converter layers (curve "6A") and cuboidal encapsulation layers 6 (curve 1002) result in pronounced volume emission. All the converter geometries exhibit good color uniformity at different angles of incidence.

Figure 6D:
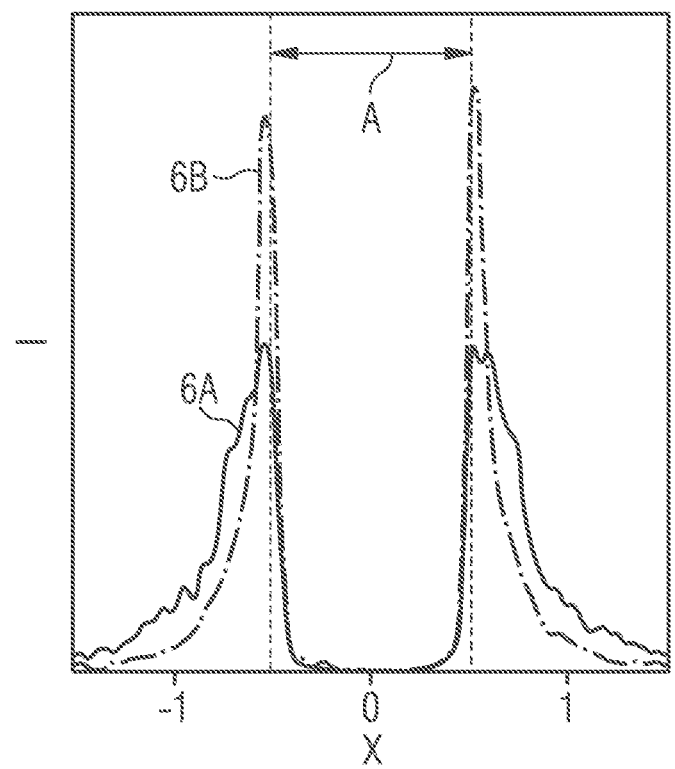

FIG. 6D shows the profile of radiant intensity I in arbitrary units in the lateral direction "x" parallel to the radiation side 16. The radiant intensity shown is that coupled out via a back face of the device. The back face of the device is the side comprising the contact elements 10, 11, i.e., the side provided for mounting and via which, ideally, no or little radiation should be coupled out. The lateral chip extent A in mm is shown in the figure with dashed lines. The coordinate origin is selected to be the middle of the semiconductor chip 1. The case of a thin converter layer 5, as depicted in FIG. 6B (curve "6B"), is shown. The case in which no encapsulation layer 6 or a thin encapsulation layer 6 of less than 1 μm in thickness is used is shown here. This is compared with the case of a thick converter potting compound according to FIG. 6A (curve "6A"). It is apparent that thin converter layers result in higher radiation exposure very close to the semiconductor chip 1. Overall radiation exposure at the back face is, however, generally higher for a thick converter potting compound.

Figure 6E:
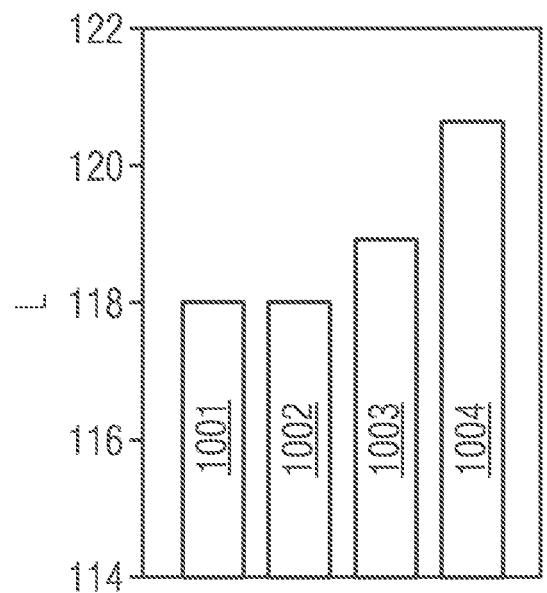

FIG. 6E shows a histogram of the intensity L in lm of the light emitted by the optoelectronic device 100 of FIG. 6B for various embodiments. It is apparent that the device without an encapsulation layer 6, see 1001, or with a cubic encapsulation layer 6, see 1002, generate approximately the same radiant intensity L. The radiant intensity L of the device 100 may be further increased or efficiency boosted by beveled edges of the encapsulation layer 6, see 1003, or a lens-shaped configuration of the encapsulation layer 6, see 1004.

The description made with reference to exemplary embodiments does not restrict the invention to these embodiments. Rather, the invention encompasses any novel feature and any combination of features, including in particular any combination of features in the claims, even if the claims or exemplary embodiments do not explicitly mention these features themselves or this combination of features itself.

The invention claimed is:

1. A method for producing optoelectronic devices, the method comprising:
    A) providing a carrier and a plurality of optoelectronic semiconductor chips, wherein each semiconductor chip comprises contact elements for external electrical contacting which are arranged on a contact side of the semiconductor chip;
    B) applying the semiconductor chips laterally adjacent one another on the carrier, wherein the contact sides face the carrier and the contact elements are laterally surrounded by protective elements;
    C) applying an electrically conductive layer on at least sub-regions of the sides of the semiconductor chips not covered by the carrier, wherein the electrically conductive layer is formed contiguously, and wherein the protective elements prevent direct contact of the contact elements with the electrically conductive layer;
    D) electrophoretically depositing a converter layer on the electrically conductive layer, wherein the converter layer is configured to convert at least a proportion of radiation emitted by the semiconductor chips into radiation of another wavelength range; and
    E) removing the electrically conductive layer from regions between the converter layer and the semiconductor chips,
    wherein, before step C), a potting compound is introduced between the semiconductor chips,
    wherein the potting compound partially or completely covers side faces of the semiconductor chips which extend transversely on the contact side,
    wherein radiation sides opposite the contact sides remain partially or completely free of the potting compound,
    wherein, in step C), the electrically conductive layer is applied to the potting compound located between the semiconductor chips, and
    wherein, in step E), the electrically conductive layer is removed from regions between the converter layer and the potting compound.

2. The method according to claim 1,
    wherein steps A) to E) are preformed in the stated sequence in succession and mutually independently,
    wherein a bonding layer is applied to the carrier,
    wherein during step B) the contact elements are pressed deeply enough into the bonding layer so that, in step C), the contact elements are protected from being covered with the electrically conductive layer,
    wherein the bonding layer comprises a thermoplastic material, and
    wherein, after step E), the semiconductor chips are detached from the carrier and singulated.

3. The method according to claim 1,
    wherein the electrically conductive layer and/or the converter layer continuously, contiguously and uninterruptedly extend over all the sides of the semiconductor chips not concealed by the carrier and at least 90% conceal these sides.

4. The method according to claim 1,
    wherein the carrier is a potting material in which the semiconductor chips are embedded so that steps A) and B) constitute a single, common step,
    wherein, after steps A) and B), the semiconductor chips are embedded in the potting material in such a manner that the contact sides are completely covered by the potting material, side faces of the semiconductor chips extending transversely of the contact side are partially or completely covered by the potting material, and radiation sides opposite the contact sides are partially or completely free of the potting material,
    wherein, after step E), holes, through which the contact elements are electrically connected, are introduced into the potting material.

5. The method according to claim 1,
    wherein, in step E), the electrically conductive layer is removed by a wet chemical process,
    wherein the electrically conductive layer comprises at least one metal or is formed from at least one metal,
    wherein, in step E), the metal is partially or completely converted by chemical reaction into a salt of the metal, and
    wherein, after step E), a mole fraction of the salt in the converter layer amounts to between 0.001% and 2% inclusive.

6. The method according to claim 1,
    wherein the converter layer has a uniform layer thickness with maximum thickness fluctuations of 5% about a mean layer thickness along the entire extent on the semiconductor chips,
    wherein, after step E), the layer thickness of the converter layer amounts to at most 70 µm, and
    wherein, after step E), the converter layer extends continuously, contiguously and uninterruptedly on the semiconductor chips.

7. The method according to claim 1,
    wherein, the converter layer comprises a powder of converter particles, and
    wherein, after step E), the converter layer is surrounded with an encapsulation layer which prevents detachment, crumbling or flaking of the converter layer from the semiconductor chips.

8. The method according to claim 7,
    wherein the encapsulation layer comprises a transparent material which is at least 90% transmissive to the radiation emitted by the semiconductor chips and/or by the converter layer, and
    wherein, after step E), the encapsulation layer is patterned comprising a plurality of lenses, wherein a portion of the patterned encapsulation layer acts as a lens for radiation emitted by the respective semiconductor chip.

9. The method according to claim 1, wherein the carrier is a printed circuit board to which the semiconductor chips are electrically connected and mechanically fastened.

10. The method according to claim 1,
    wherein a protective frame for each semiconductor chip is applied to the carrier,
    wherein, during step B), the semiconductor chips are placed on the carrier in such a manner that the contact elements are at least partially surrounded by the corresponding protective frame, and
    wherein the protective frames prevent the contact elements from being covered with the electrically conductive layer in step C).

11. The method according to claim 1,
    wherein the semiconductor chips are sapphire flip chips in each case comprising a sapphire growth substrate which stabilizes the semiconductor chip and a semiconductor layer sequence grown on the sapphire growth substrate, and
    wherein the contact elements are arranged on a side of the semiconductor layer sequence remote from the sapphire growth substrate.

12. The method according to claim 1,
wherein the semiconductor chips are thin-film semiconductor chips in each case comprising a substrate which stabilizes the semiconductor chip and a semiconductor layer sequence applied to the substrate,
wherein the substrate differs from a growth substrate of the semiconductor layer sequence and the growth substrate is removed from the semiconductor chip, and
wherein the contact elements are applied to a side of the substrate remote from the semiconductor layer sequence.

13. A surface-mountable optoelectronic device comprising:
an optoelectronic semiconductor chip with uncovered contact elements for external electrical contacting of the device, wherein the contact elements are arranged on a common contact side of the semiconductor chip;
a continuous, contiguous and uninterrupted converter layer which at least 90% conceals a radiation side of the semiconductor chip which is opposite the contact side; and
an encapsulation layer which is applied to the converter layer and completely conceals and encloses the converter layer,
wherein the converter layer is configured to convert at least a proportion of radiation emitted by the semiconductor chip into radiation of another wavelength range,
wherein the converter layer has a uniform layer thickness with maximum thickness fluctuations of 5% about a mean layer thickness along an entire extent on the semiconductor chip,
wherein the layer thickness of the converter layer amounts to at most 70 μm,
wherein the converter layer comprises a powder of converter particles which is held on the semiconductor chip by the encapsulation layer,
wherein the semiconductor chip is embedded in a potting material,
wherein the potting material completely covers all the side faces of the semiconductor chip which extend transversely of the contact side, and
wherein side faces are not concealed by the converter layer.

14. The optoelectronic device according to claim 13, wherein the converter layer comprises a salt of a metal, a mole fraction of which in the converter layer amounts to between 0.001% and 2% inclusive.

15. The optoelectronic device according to claim 13, wherein, in addition to the radiation side, all the side faces of the semiconductor chip which extend transversely of the contact side are at least 90% concealed by the converter layer.

16. The optoelectronic device according to claim 13, wherein the converter layer is arranged in places on the potting material and, in a lateral direction parallel to the contact side, terminates flush with the potting material.

17. The optoelectronic device according to claim 13, wherein in a lateral direction parallel to the contact side, the converter layer is surrounded by the potting material, and wherein, in a direction away from the radiation side, the potting material and the converter layer terminate flush with one another.

18. The optoelectronic device according to claim 13, wherein the encapsulation layer is a transparent silicone potting compound, and wherein, on a side of the device opposite the contact side, the silicone potting compound has beveled edges.

19. The optoelectronic device according to claim 13, wherein the potting material comprises a white plastic.

20. A method for producing optoelectronic devices, the method comprises:
A) providing a carrier and a plurality of optoelectronic semiconductor chips, wherein each semiconductor chip comprises contact elements for external electrical contacting which are arranged on a contact side of the semiconductor chip, wherein a bonding layer is applied to the carrier, the bonding layer comprises a thermoplastic material, and/or wherein a protective frame for each semiconductor chip is applied to the carrier;
B) applying the semiconductor chips laterally adjacent one another onto the carrier, wherein the contact sides face the carrier, wherein the contact elements are pressed so deeply into the bonding layer that the bonding layer froms protective elements, which laterally surround the contact elements, and/or wherein the semiconductor chips are placed on the carrier in such a manner that the contact elements are at least partially surrounded by the corresponding protective frame;
C) applying an electrically conductive layer onto at least sub-regions of the sides of the semiconductor chips not covered by the carrier, wherein the electrically conductive layer is formed contiguously and wherein the protective elements and/or the protective frame prevent direct contact of the contact elements with the electrically conductive layer;
D) electrophoretically depositing a converter layer on the electrically conductive layer, wherein the converter layer is configured to convert at least a proportion of radiation emitted by the semiconductor chips into radiation of another wavelength range; and
E) removing the electrically conductive layer from regions between the converter layer and the semiconductor chips, wherein steps A) to E) are performed in the stated sequence in succession and mutually independently.

* * * * *